(12) United States Patent
Atoji et al.

(10) Patent No.: US 8,009,394 B2
(45) Date of Patent: Aug. 30, 2011

(54) LEAK CURRENT BREAKER AND METHOD

(75) Inventors: Toyotsugu Atoji, Kawasaki (JP);
Kiyoshi Miyazawa, Yamato (JP)

(73) Assignee: Toyotsugu Atoji, Kanagawa (JP)

( * ) Notice: Subject to any disclaimer, the term of this patent is extended or adjusted under 35 U.S.C. 154(b) by 778 days.

(21) Appl. No.: 11/883,263

(22) PCT Filed: Jan. 31, 2005

(86) PCT No.: PCT/JP2005/001361
§ 371 (c)(1),
(2), (4) Date: Oct. 22, 2007

(87) PCT Pub. No.: WO2006/035519
PCT Pub. Date: Apr. 6, 2006

(65) Prior Publication Data
US 2008/0165462 A1 Jul. 10, 2008

(51) Int. Cl.
*H02H 3/00* (2006.01)
(52) U.S. Cl. .............................. 361/44; 361/42; 324/551
(58) Field of Classification Search ................... 361/44, 361/47, 48, 42; 324/551, 522, 525; 340/650
See application file for complete search history.

(56) References Cited

U.S. PATENT DOCUMENTS
6,025,980 A * 2/2000 Morron et al. .................. 361/42
(Continued)

FOREIGN PATENT DOCUMENTS
JP 54-73681 6/1979
(Continued)

OTHER PUBLICATIONS

Netz, H. et al., Zukai Kougaku/Gijyutsu no Koushiki, Kabushiki Kaisha Gijyutsuhyouonsha, Oct. 1, 2000, pp. 177-179, together with English language translation.

(Continued)

*Primary Examiner* — Patrick Salce
(74) *Attorney, Agent, or Firm* — Scully, Scott, Murphy & Presser, P.C.

(57) ABSTRACT

A leak current breaker is provided which includes a detector (10) to detect a leakage current from electric lines, a first removing unit (12) to convert the detected leakage current into a voltage and a voltage detector (14) to detect a voltage developed in electric lines A under testing, a second removing unit (16) to remove a harmonic component included in the voltage, a phase contrast detector (20) to detect a phase contrast from a signal waveform having the harmonic component removed, a frequency calculator (21) to calculate a frequency occurring on electric lines A on the basis of the signal waveform of the voltage having the harmonic component removed by the second removing unit (16), a phase angle calculator (22) to calculate a phase angle of the leakage current flowing through the electric lines A on the basis of the phase contrast and frequency, a root-mean-square value calculator (24) to calculate a root-mean-square value of the voltage having the harmonic component removed by the first removing unit (12), a calculator (27) to calculate a leakage current component Igr arising from an earth insulation resistance included in the leakage current flowing through the electric lines A on the basis of the root-mean-square value and phase angle of the leakage current, a judging unit (29) to judge whether the leakage current component Igr calculated by the calculator (27) has exceeded an arbitrary value, and a circuit breaker (30) to break the electric lines A on the basis of the judgment made by the judging unit (29).

10 Claims, 9 Drawing Sheets

U.S. PATENT DOCUMENTS 7,161,354 B2    1/2007   Takakamo et al.

FOREIGN PATENT DOCUMENTS

| | | |
|---|---|---|
| JP | 55-148664 | 10/1980 |
| JP | H01-144322 | 6/1989 |
| JP | 4-92914 | 12/1992 |
| JP | 6-57037 | 8/1994 |
| JP | 7-29477 | 6/1995 |
| JP | 9-19046 | 1/1997 |
| JP | 2001-021604 | 1/2001 |
| JP | 2001-215247 | 8/2001 |
| JP | 2001-346327 | 12/2001 |
| JP | 2002-098729 | 4/2002 |
| JP | 2002-125313 | 4/2002 |
| JP | 2003-232826 | 8/2003 |
| JP | 2004-12147 | 1/2004 |
| JP | 2004-184346 | 7/2004 |
| JP | 2004-317466 | 11/2004 |
| JP | 2005-140532 | 6/2005 |
| SU | 1069054 | 1/1984 |
| SU | 1484240 | 1/1993 |

OTHER PUBLICATIONS

U.S. Office Action dated Nov. 22, 2010 from related case U.S. Appl. No. 11/921,977.

International Search Report dated Feb. 28, 2006 from related case U.S. Appl. No. 11/921,977.

* cited by examiner

FIG.4A
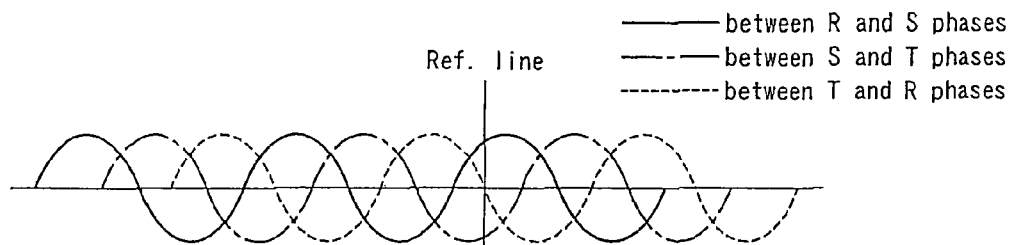
Ref. line
— between R and S phases
—·— between S and T phases
------- between T and R phases
FIG.4B
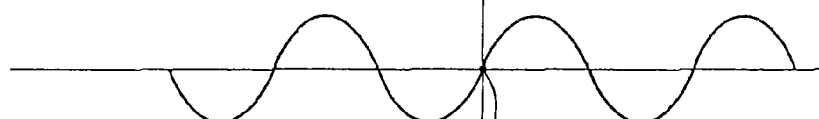
a
FIG.4C
120°
60°
— between R and S phases (R-phase Igr)
—·— between T and S phases (T-phase Igr)
FIG.4D
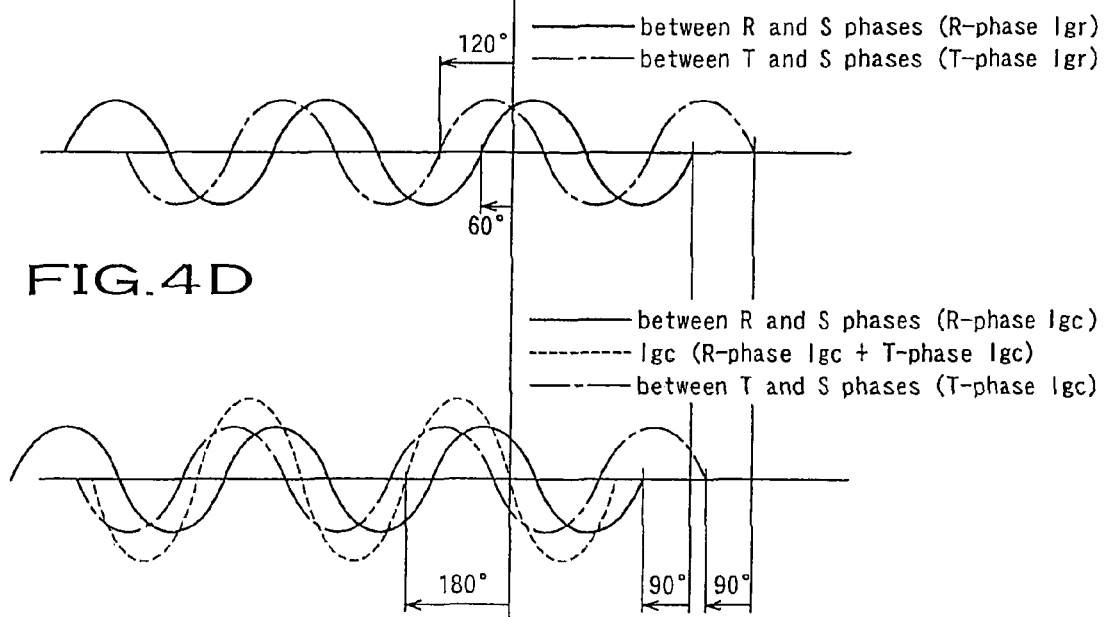
— between R and S phases (R-phase Igc)
------- Igc (R-phase Igc + T-phase Igc)
—·— between T and S phases (T-phase Igc)
180°  90° 90°
FIG.4E
— between R and S phases (R-phase Igr)
------- Igc (R-phase Igc + T-phase Igc)
—·— between T and S phases (T-phase Igr)
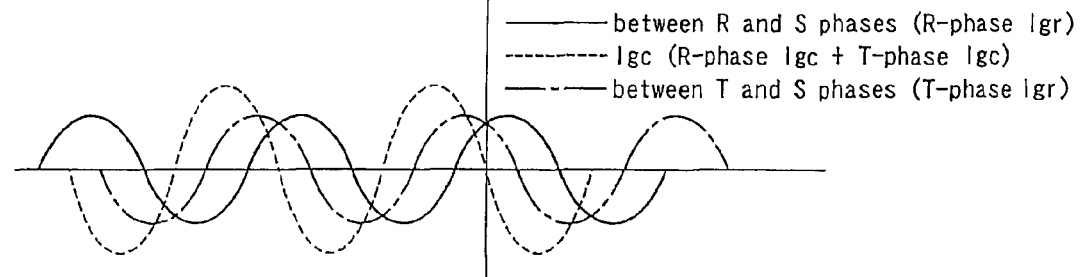

| Time (min) | 1 ch Igr (mA) | 1 ch Io (mA) | 1 ch Gr (kΩ) | Remarks |
|---|---|---|---|---|
| 1 | 2 | 9.3 | 106.7 | With no resistor being connected |
| 2 | 2 | 9.3 | 107.4 | With no resistor being connected |
| 3 | 2 | 9.4 | 106.9 | With no resistor being connected |
| 4 | 2 | 9.3 | 106.5 | With no resistor being connected |
| 5 | 2 | 9.5 | 105.3 | With no resistor being connected |
| 6 | 12.3 | 11.4 | 17.2 | With resistor of 20kΩ being connected to R phase |
| 7 | 12.4 | 11.4 | 17.2 | With resistor of 20kΩ being connected to R phase |
| 8 | 12.4 | 11.4 | 17.2 | With resistor of 20kΩ being connected to R phase |
| 9 | 12.3 | 17.8 | 17.4 | With resistor of 20kΩ being connected to T phase |
| 10 | 12.4 | 17.9 | 17.4 | With resistor of 20kΩ being connected to T phase |
| 11 | 2 | 9.3 | 104.3 | With resistor disconnected |
| 12 | 22.7 | 19.6 | 9.5 | With resistor of 10kΩ being connected to R phase |
| 13 | 23 | 27.9 | 9.2 | With resistor of 10kΩ being connected to T phase |
| 14 | 23.2 | 28.1 | 9.2 | With resistor of 10kΩ being connected to T phase |
| 15 | 2 | 9.4 | 105.9 | With resistor disconnected |

FIG.7

| Time (min) | 1 ch | | | Remarks |
|---|---|---|---|---|
| | Igr (mA) | Io (mA) | Gr (kΩ) | |
| 1 | 7.6 | 75.9 | 27.8 | With no capacitor being connected |
| 2 | 7.8 | 100.8 | 27.0 | With capacitor of 0.22 μF being connected between R and T phases |
| 3 | 8.0 | 101.1 | 26.5 | With capacitor of 0.22 μF being connected between R and T phases |
| 4 | 21.0 | 107.0 | 10.1 | With capacitor of 0.22 μF being connected between R and T phases and resistor of 20kΩ being connected to T phase |
| 5 | 7.7 | 75.5 | 27.4 | With capacitor disconnected |

FIG.8

LEAK CURRENT BREAKER AND METHOD

TECHNICAL FIELD

The present invention relates to a leak current breaker and method for detecting a leakage current from an electric circuit under testing to interrupt the leakage current.

BACKGROUND ART

Everyday life is carried on without much awareness of electricity. Since electricity is widely used as a source of energy in various fields, such as information processing, communication, and the like, it is indispensable in modern life.

Since electrical energy is important and useful, any failure in appropriate management and use thereof will possibly result in accidents such as short circuit-caused fires, electrocution, etc.

For example, a leakage current that will possibly cause such a serious accident is deeply linked with poor insulation of a circuit or device through which an electric current flows. However, checking for a leakage current takes a very long time and needs a momentary interruption of the power supply, and the numerical value of electric current corresponding to poor insulation has to be measured by an insulation resistance tester.

These days computers are used widely in society. In intelligent buildings and factory automation (FA), computer systems are continuously running day and night. Such computer systems should be checked for any leakage current while continuing to operate, that is, without being turned off even for a very short time.

Therefore, the present highly sophisticated information society requires maintenance of an uninterruptible power supply system. On this account, the insulation management of circuits and devices, through which an electric current flows, has been shifted from the conventional method of checking for a leakage current by the insulation resistance tester with power interruption, to a leakage current measurement which can be done with no power interruption. For this insulation management, there has been proposed a variety of methods of keeping power supply during measurement of a leakage current by a leak current breaker, earth leakage fire alarm or the like (as in Japanese Unexamined Patent Application Publication No. 2001-215247 and 2002-98729).

Note here that the leakage currents (I) include a leakage current (Igc) caused by earth capacitance and leakage current (Igr) caused by an earth insulation resistance involved directly with an insulation resistance. Since the above-mentioned short circuit-caused fire arises from insulation resistance, if the leakage current (Igr) alone, that arises from the insulation resistance, can accurately be detected in a circuit, it is possible to check the insulation state of the circuit and thus prevent a catastrophe such as a short circuit-caused fire or the like.

DISCLOSURE OF THE INVENTION

Problems to be Solved by the Invention

In many factories, however, electrical devices are connected to each other by long electric lines. This large length of the electric lines will add to the earth capacitance, and thus the leakage current (Igc) arising from the earth capacitance will be correspondingly large.

Also, each of such electric devices has installed therein an inverter in which a power semiconductor device is applied. Since the inverter is used as a high-speed switch, a harmonic distortion current will inevitably occur as a sine-wave signal whose frequency is an integral multiple of 50 or 60 Hz which is the fundamental frequency of commercial power supplies. Since the harmonic distortion current contains a high frequency component, it will flow to the electric lines through the earth capacitance naturally distributed along the electric lines and increase the value of the leakage current (I).

Therefore, the leakage current (Igr) arising from the earth insulation resistance involved directly with the quality of the insulation will be adversely affected by the harmonic distortion current caused by the length of the electric lines, inverter, etc. and will thus become difficult to accurately detect.

Also, in electronic devices in which parts are installed with a high density, such as telephone, facsimile, printer, copier, etc., when leakage current is measured by the insulation resistance tester or the like to locate poor insulation, the electronic circuits will possibly be influenced by a test voltage which is applied. Therefore, since it is likely that such electronic devices will functionally be damaged, many of them cannot be tested for insulation resistance.

It is therefore desirable to overcome the above-mentioned drawbacks of the related art by providing a leak current breaker and method, for measuring a leakage current flowing through electric lines, mechanical facility or the like, and detecting only a leakage current (Igr) arising from an earth insulation resistance involved directly with the quality of an insulation, simply and safety, from outside without having to break the electric lines, mechanical facility or the like during detection of the leakage current, without any functional damage of devices connected to the electric lines under testing, and with interrupting only the electric lines under testing on the basis of the detected leakage current.

Means for Solving the Problems

According to the present invention, there is provided a leak current breaker including, according to the present invention, a leakage current detecting means for detecting a leakage current flowing through electric lines under testing, a converting means for converting the leakage current detected by the leakage current detecting means into a voltage, an amplifying means for amplifying the voltage output from the converting means, a first harmonic component removing means for removing a harmonic component from the voltage amplified by the amplifying means, a voltage detecting means for detecting a voltage developed on the electric lines under testing, a second harmonic component removing means for removing a harmonic component from the voltage detected by the voltage detecting means, a phase contrast detecting means for detecting a contrast in signal waveform between the voltage from which the harmonic component has been removed by the first harmonic component removing means and the voltage from which the harmonic component has been removed by the second harmonic component removing means, a frequency calculating means for calculating a frequency occurring on a voltage line on which the voltage has been detected by the voltage detecting means on the basis of the signal waveform of the voltage having the harmonic component removed by the second harmonic component removing means, a phase angle calculating means for calculating a phase angle of the leakage current flowing through the electric lines under testing on the basis of the phase contrast detected by the phase contrast detecting means and frequency calculated by the frequency calculating means, a root-mean-square value calculating means for calculating a root-mean-square value of the voltage having the harmonic component removed by the first harmonic component removing means, an earth insulation resistance-caused leakage current component calculating means for calculating a leakage current component arising from an earth insulation resistance included in the leakage current flowing through the electric lines under testing on the basis of the root-mean-square value calculated by the root-mean-square value calculating means and phase angle of the leakage current flowing through the electric lines under testing, calculated by the phase angle calculating means, a judging means for judging whether the leakage current component arising from the earth insulation resistance included in the leakage current flowing through the electric lines under testing and calculated by the earth insulation resistance-caused leakage current component calculating means has exceeded an arbitrary value, and a circuit breaking means for breaking the electric lines under testing on the basis of the judgment made by the judging means.

According to the present invention, there is also provided a leakage current interruption method including, according to the present invention, a leakage current detecting step of detecting a leakage current flowing through electric lines under testing, a converting step of converting the leakage current detected in the leakage current detecting step into a voltage, an amplifying step of amplifying the voltage output from the converting step, a first harmonic component removing step of removing a harmonic component from the voltage amplified in the amplifying step, a voltage detecting step of detecting a voltage developed on the electric lines under testing, a second harmonic component step of removing a harmonic component from the voltage detected in the voltage detecting step, a phase-contrast detecting step of detecting a contrast in signal waveform between the voltage from which the harmonic component has been removed in the first harmonic component removing step and the voltage from which the harmonic component has been removed in the second harmonic component removing step, a frequency calculating step of calculating a power frequency occurring on a voltage line on which the voltage has been detected in the voltage detecting step on the basis of the signal waveform of the voltage having the harmonic component removed in the second harmonic component removing step, a phase angle calculating step of calculating a phase angle of the leakage current flowing through the electric lines under testing on the basis of the phase contrast detected in the phase contrast detecting step and power frequency calculated in the frequency calculating step, a root-mean-square value calculating step of calculating a root-mean-square value of the voltage having the harmonic component removed in the first harmonic component removing step, an earth insulation resistance-caused leakage current component calculating step of calculating a leakage current component arising from an earth insulation resistance included in the leakage current flowing through the electric lines under testing on the basis of the root-mean-square value calculated in the root-mean-square value calculating step and phase angle of the leakage current flowing through the electric lines under testing, calculated in the phase angle calculating step, a judging step of judging whether the leakage current component arising from the earth insulation resistance included in the leakage current flowing through the electric lines under testing and calculated in the earth insulation resistance-caused leakage current component calculating step has exceeded an arbitrary value, and a breaking step of breaking the electric lines under testing on the basis of the judgment made in the judging step.

These objects and other objects, features and advantages of the present invention will become more apparent from the following detailed description of the best mode for carrying out the present invention when taken in conjunction with the accompanying drawings.

BRIEF DESCRIPTION OF THE DRAWINGS

FIG. 4 shows, by waveforms, the leakage current detection by the leakage current detector according to the present invention;

FIG. 7 shows a first data example when electric lines are actually tested by the leakage current detector according to the present invention;

FIG. 8 shows a second data example when electric lines are actually tested by the leakage current detector according to the present invention;

PREFERRED MODE FOR CARRYING OUT THE INVENTION

The present invention will be described in detail below with respect to a leakage current interrupter as an embodiment thereof with reference to the accompanying drawings.

Figure 1:
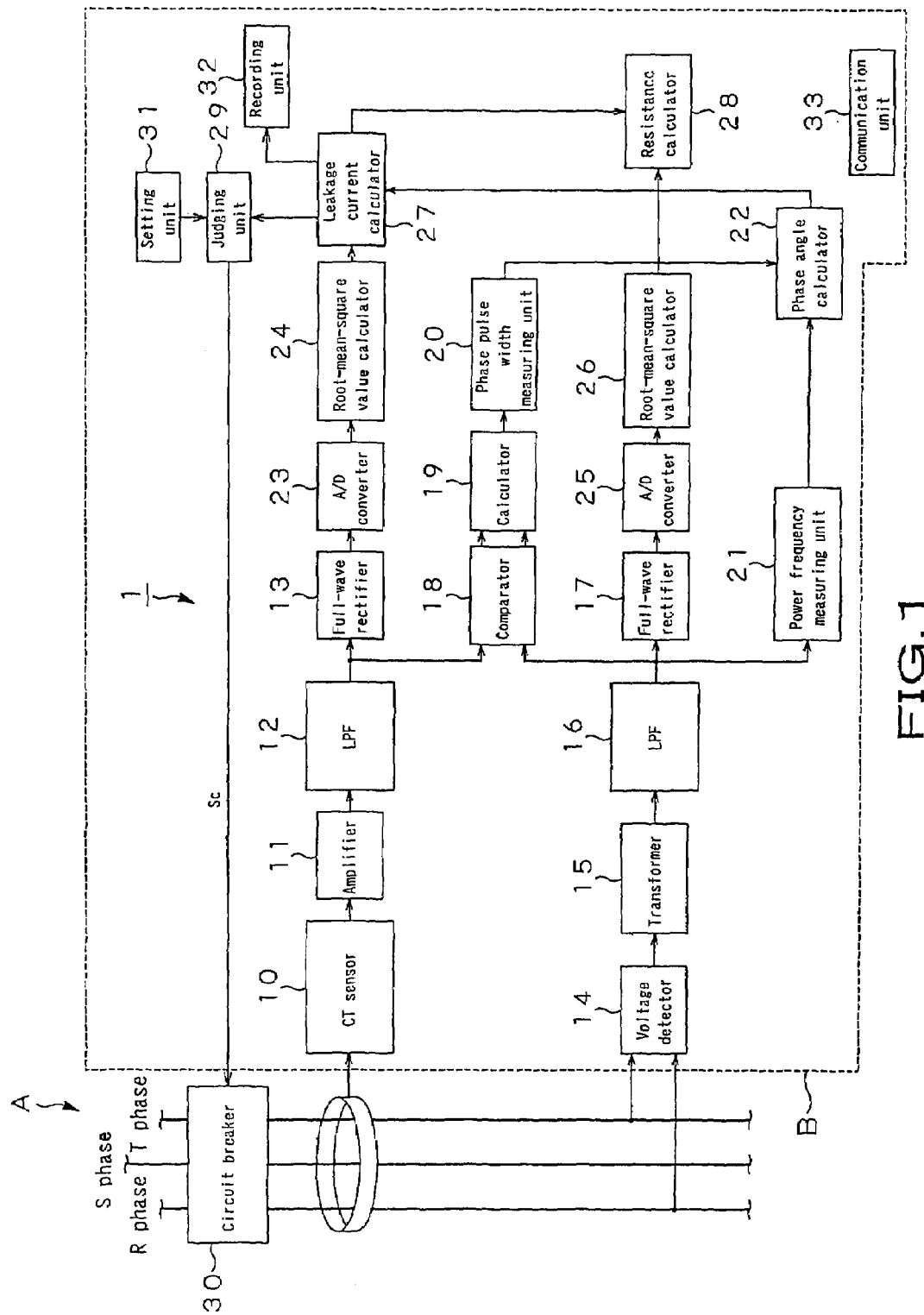
FIG. 1 is a block diagram of a leakage current detector according to the present invention.

As shown in FIG. 1, the leakage current interrupter, generally indicated with a reference numeral 1, includes a current transformer type sensor (will be referred to as "CT sensor" hereunder) 10 clamped to the entire electric lines A under testing to detect a leakage current I flowing through the electric lines A, an amplifier 11 to convert the leakage current I detected by the CT sensor 10 into a voltage and amplify the voltage V1 resulting from the conversion (will be referred to as "converted voltage" hereunder), a low-pass filter 12 (will be referred to as "LPF" hereunder) to remove a harmonic component from the converted voltage V1 after amplification, a full-wave rectifier 13 to rectify the converted voltage V1 having the harmonic component removed by the LPF 12, a voltage detector 14 to detect a voltage V2 from a voltage line included in the electric lines A, a transformer 15 to change the voltage V2 detected by the voltage detector 14 to a predetermined transformation ratio, a low-pass filter (will be referred to as "LPF" hereunder) 16 to remove a harmonic component from the voltage V2 changed by the transformer 15 to have a predetermined value, a full-wave rectifier 17 to rectify the voltage V2 from which the harmonic component has been removed by the LPF 16, a comparator 18 to make a comparison between a signal waveform S1 of the converted voltage V1 having the harmonic component removed by the LPF 12 and a signal waveform S2 of the voltage V2 having the harmonic component removed by the LPF 16, a calculator 19 to make a predetermined calculation on the basis of the result of comparison from the comparator 18, a phase pulse width measuring unit 20 to measure the phase pulse width on the basis of the result of calculation from the calculator 19, a power frequency measuring unit 21 to measure a power frequency occurring on the voltage line included in the electric lines A from a signal indicative of the voltage V2 having the harmonic component removed by the LPF 16, a phase angle calculator 22 to calculate the phase angle of the leakage current I flowing through the electric lines A from the phase pulse width measured by the phase pulse width measuring unit 20 and power frequency measured by the power frequency measuring unit 21, an A-D converter 23 to convert the converted voltage V1 rectified by the full-wave rectifier 13 into a digital signal, a root-mean-square value calculator 24 to calculate the root-mean-square value of the converted voltage V1 converted by the A-D converter 23 into the digital signal, an A-D converter 25 to convert the voltage V2 rectified by the full-wave rectifier 17 into a digital signal, a root-mean-square value calculator 26 to calculate the root-mean-square value of the voltage V2 converted by the A-D converter 25 into the digital signal, a leakage current calculator 27 to calculate a leakage current Igr arising from an earth insulation resistance from the phase angle of the leakage current I calculated by the phase angle calculator 22 and root-mean-square value of the converted voltage V1 calculated by the root-mean-square value calculator 24, a resistance calculator 28 to calculate the value of the earth insulation resistance from the leakage current I calculated by the leakage current calculator 27 and root-mean-square value of the voltage V2 calculated by the root-mean-square value calculator 26, a judging unit 29 to judge whether the leakage current Igr calculated by the leakage current calculator 27 has exceeded an arbitrary value, a circuit breaker 30 to break the electric lines A on the basis of the result of judgment from the judging unit 29, and a communication unit 33 to make communications with an external device. Similar to the conventional earth leakage breaker, the circuit breaker 30 has a breaking speed of approximately 2 cycles (0.04 sec with a power frequency of 50 Hz) to 5 cycles (0.1 sec with a power frequency of 50 Hz). Also, it should be noted that in the leakage current interrupter 1 according to the present invention, a block indicated with a letter B in FIG. 1 is made as a chip to detect a root-mean-square value $I_0$ in the conventional leakage current breaker.

The above CT sensor 10 detects magnetism arising from a leakage current component flowing through the electric lines A under testing and produces a current from the detected magnetism. The CT sensor 10 supplies the amplifier 11 with the current thus produced as a leakage current I. It should be noted that the leakage current I produced by the CT sensor 10 comprises a leakage current Igc arising from an earth capacitance, and a leakage current Igr arising from an earth insulation resistance involved directly with an insulation resistance. It should also be noted that the leakage current Igc will increase corresponding to the length of the electric lines A and will also be increased due to a harmonic distortion current arising from an inverter, noise filter and the like, included in an electric device.

The amplifier 11 converts the leakage current I supplied from the CT sensor 10 into a voltage and amplifies the converted voltage V1 up to a predetermined level. Also, in cases where the leakage current I supplied from the CT sensor 10 is 0 to 10 mA, the amplifier 11 amplifies the converted voltage V1 in two steps. In cases where the leakage current I supplied from the CT sensor 10 is 10 to 300 mA, the amplifier 11 amplifies the converted voltage V1 in a single step. The amplifier 11 supplies the converted voltage V1 after amplification to the LPF 12. The LPF 12 removes (filters out) a harmonic component from the converted voltage V1. The LPF 12 supplies the converted voltage V1 having the harmonic component thus removed, to the full-wave rectifier 13 and comparator 18. The full-wave rectifier 13 rectifies the supplied converted voltage V1, and supplies the converted voltage V1 thus rectified to the A-D converter 23.

The voltage detector 14 has a voltage probe thereof connected to the electric lines A under testing to detect a voltage developed on a voltage line included in the electric lines A. It should be noted that in cases where the electric lines A are of a three-phase three-wire system (delta connection type), the voltage detector 14 detects a voltage between R and T phases, outside of S phase (grounding). Also, in cases where the electric lines A are of a three-phase four-wire system (star connection type), the voltage detector 14 detects a voltage between phases, outside of the grounding wire. Also, in cases where the electric lines A are of a single-phase two-wire system, the voltage detector 14 detects a voltage between N and L phases.

The voltage detector 14 determines a reference point from the voltage V2 detected from the electric lines A and supplies the voltage V2 to the transformer 15. For example, the voltage detector 14 determines, as the reference point, a point where the voltage V2 detected from the electric lines A crosses zero (zero-cross point).

The transformer 15 changes the supplied voltage V2 into a voltage of a predetermined value, and supplies the transformed voltage V to the LPF 16. The transformer 15 changes the voltage V2 to a transformation ratio of 20:1, for example. The LPF 16 removes a harmonic component from the supplied voltage V2. The LPF 16 supplies the voltage V2 having the harmonic component removed to the full-wave rectifier 17, comparator 18 and power frequency measuring unit 21. The full-wave rectifier 17 rectifies the supplied voltage V2 and supplies the rectified voltage V2 to the A-D converter 25.

The comparator 18 takes a zero-cross point of the converted voltage V1 supplied from the LPF 12 and converts the voltage V1 into a signal having a square wave, and supplies the square-wave signal to the calculator 19. Also, the comparator 18 takes zero-cross point of the voltage V2 supplied from the LPF 16 and converts it into a signal having a square wave, and supplies the square-wave signal to the calculator 19.

The calculator 19 makes a predetermined calculation on the basis of the signal supplied from the comparator 18 and supplies the calculated signal to the phase pulse width measuring unit 20. The calculator 19 is, for example, an EXOR (exclusive OR) circuit to make EXOR calculation of two square-wave signals from the comparator 18.

Figures 2A, 2B:
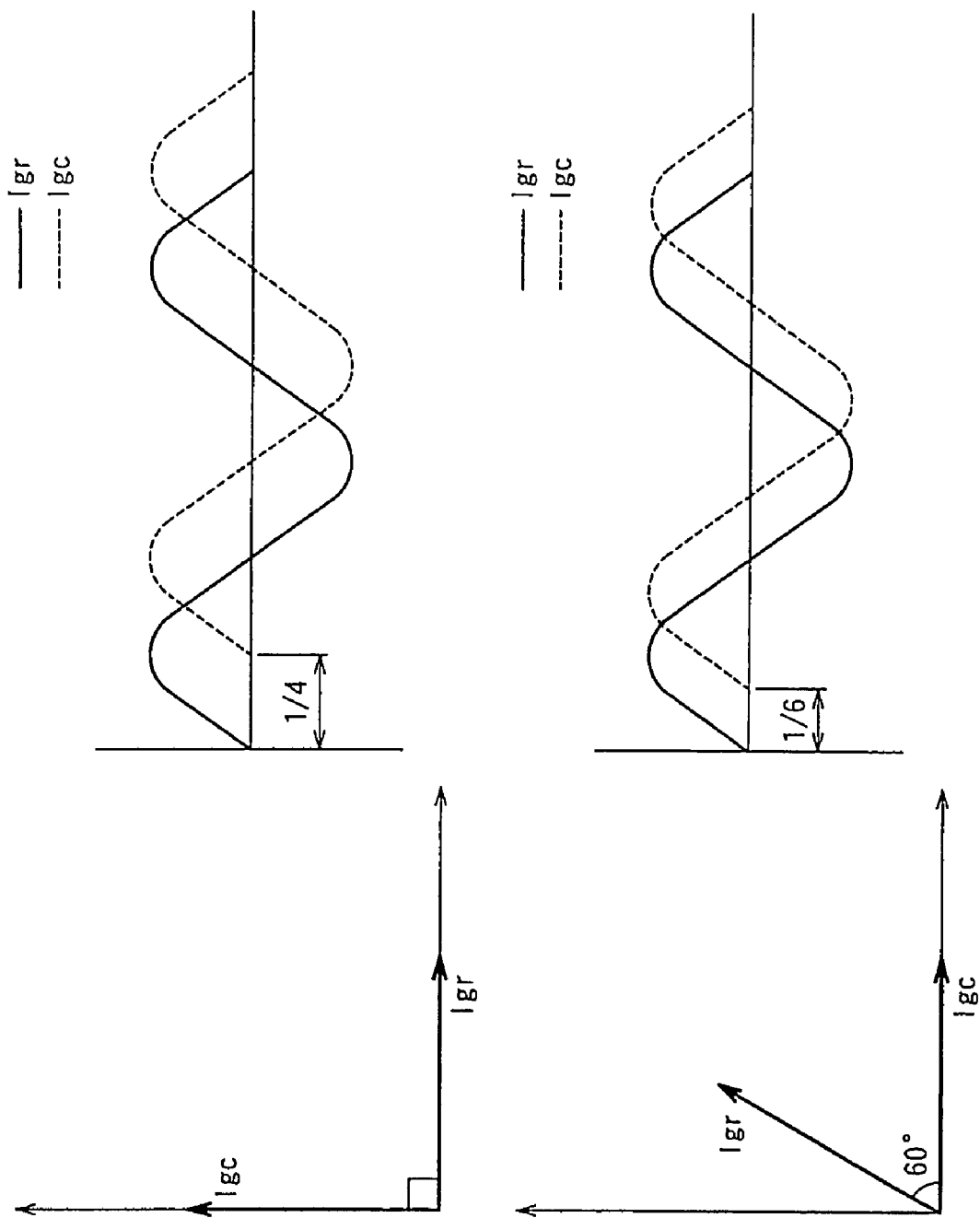
FIG. 2 illustrates phase contrasts between leakage currents Igr and Igc when the power is a single-phase one and a three-phase one, respectively.

The phase pulse width measuring unit 20 detects phase pulse widths of the converted voltages V1 and V2 on the basis of the result of calculation from the calculator 19. The phase pulse width measuring unit 20 functions as will be explained below:

In case the electric lines A under testing are of a single-phase system, the phase angle θ of the leakage current Igr is 0 deg. and phase angle θ of the leakage current Igc is 90 deg. as shown in FIG. 2A. Therefore, the phase contrast between the leakage currents Igr and Igc is 90 deg. (¼ cycle). Also, in cases where the power is a three-phase one, the phase angle θ of the leakage current Igr is 60 deg. and phase angle θ of the leakage current Igc is 0 deg. as shown in FIG. 2B. Therefore, the phase contrast between the leakage currents Igr and Igc is 60 deg. (⅙ cycle). Thus, the phase pulse width measuring unit 20 is applicable to a phase pulse width of ¼ or less of one cycle so that it can measure a phase angle whether the power is a single-phase or three-phase one.

Therefore, the phase pulse width measuring unit 20 supplies the phase angle calculator 22 with a phase pulse width of less than ¼ of one cycle, calculated based on the result of calculation from the calculator 19. It should be noted that in cases where the power frequency is 60 Hz, one cycle is 16.6 ms and thus the phase pulse width is 4.15 ms or less, and that in cases where the power frequency is 50 Hz, one cycle is 20 ms and thus the phase pulse width is 5 ms or less.

The power frequency measuring unit 21 measures a power frequency on the basis of the voltage V2 supplied from the LPF 16, and supplies the result of measurement to the phase angle calculator 22. It should be noted that in cases where the electric lines A under testing are intended for a commercial power system, the result of measurement from the power frequency measuring unit 21 is 50 or 60 Hz. Also, the power frequency measuring unit 21 may be adapted to judge, based on the voltage V2 supplied from the LPF 16, whether the power frequency is 50 or 60 Hz.

The phase angle calculator 22 calculates, by an equation (1) given below, the phase angle θ of the leakage current I flowing through the electric lines A under testing on the basis of a phase pulse width W supplied from the phase pulse width measuring unit 20 and power frequency F supplied from the power frequency measuring unit 21:

$$\theta = 360 \times W \times F \quad (1)$$

The phase angle calculator 22 supplies the calculated phase angle θ to the leakage current calculator 27.

The A-D converter 23 converts the converted voltage V1 supplied from the full-wave rectifier 13 into a digital signal and supplies the digital signal to the root-mean-square value calculator 24. This root-mean-square value calculator 24 calculates, by an equation (2) given below, a root-mean-square value $I_0$ of the converted voltage V1 on the basis of the signal supplied from the A-D converter 23. It should be noted that the signal supplied to the root-mean-square value calculator 24 is taken as for convenience of explanation because it is based on the converted voltage V1 resulting from conversion of the leakage current I flowing through the electric lines A under testing.

$$I_0 = I \times (\pi/2)/\sqrt{2}$$

The root-mean-square value calculator 24 supplies the calculated root-mean-square value $I_0$ to the leakage current calculator 27.

Also, the A-D converter 25 converts the rectified voltage V2 supplied from the full-wave rectifier 17 into a digital signal, and supplies the digital signal to the root-mean-square value calculator 26. This root-mean-square value calculator 26 calculates, by an equation (3) given below, a root-mean-square value $V_0$ of the voltage V2 on the basis of the signal supplied from the A-D converter 25:

$$V_0 = V \times (\pi/2)/\sqrt{2} \quad (3)$$

The root-mean-square value calculator 26 supplies the calculated root-mean-square value $V_0$ to the resistance calculator 28.

The leakage current calculator 27 calculates a leakage current Igr on the basis of the phase angle θ supplied from the phase angle calculator 22 and root-mean-square value $I_0$ supplied from the root-mean-square value calculator 24, and supplies the calculated leakage current Igr to the resistance calculator 28. It should be noted that in cases where the power is a single-phase one, the leakage current Igr is to be calculated using an equation (4) given below, and that in cases where the power is three-phase, the leakage current Igr is to be calculated using an equation (5) given below:

$$Igr = I_0 \times \cos\theta \quad (4)$$

$$Igr = (I_0 \times \sin\theta)/\cos 30° \quad (5)$$

Note that the leakage current calculator 27 judges, based on a selected position of a rotary switch, whether the power is single-phase or three-phase.

The resistance calculator 28 calculates, by an equation (6) given below, a resistance Gr on the basis of the root-mean-square value $V_0$ supplied from the root-mean-square value calculator 26 and leakage current Igr supplied from the leakage current calculator 27:

$$Gr = V_0/Igr \quad (6)$$

In cases where the leakage current Igr calculated by the leakage current calculator 27 exceeds an arbitrary value, the judging unit 29 generates a predetermined cutoff signal $S_c$ and supplies the cutoff signal $S_c$ thus generated to the circuit breaker 30.

Figure 3:
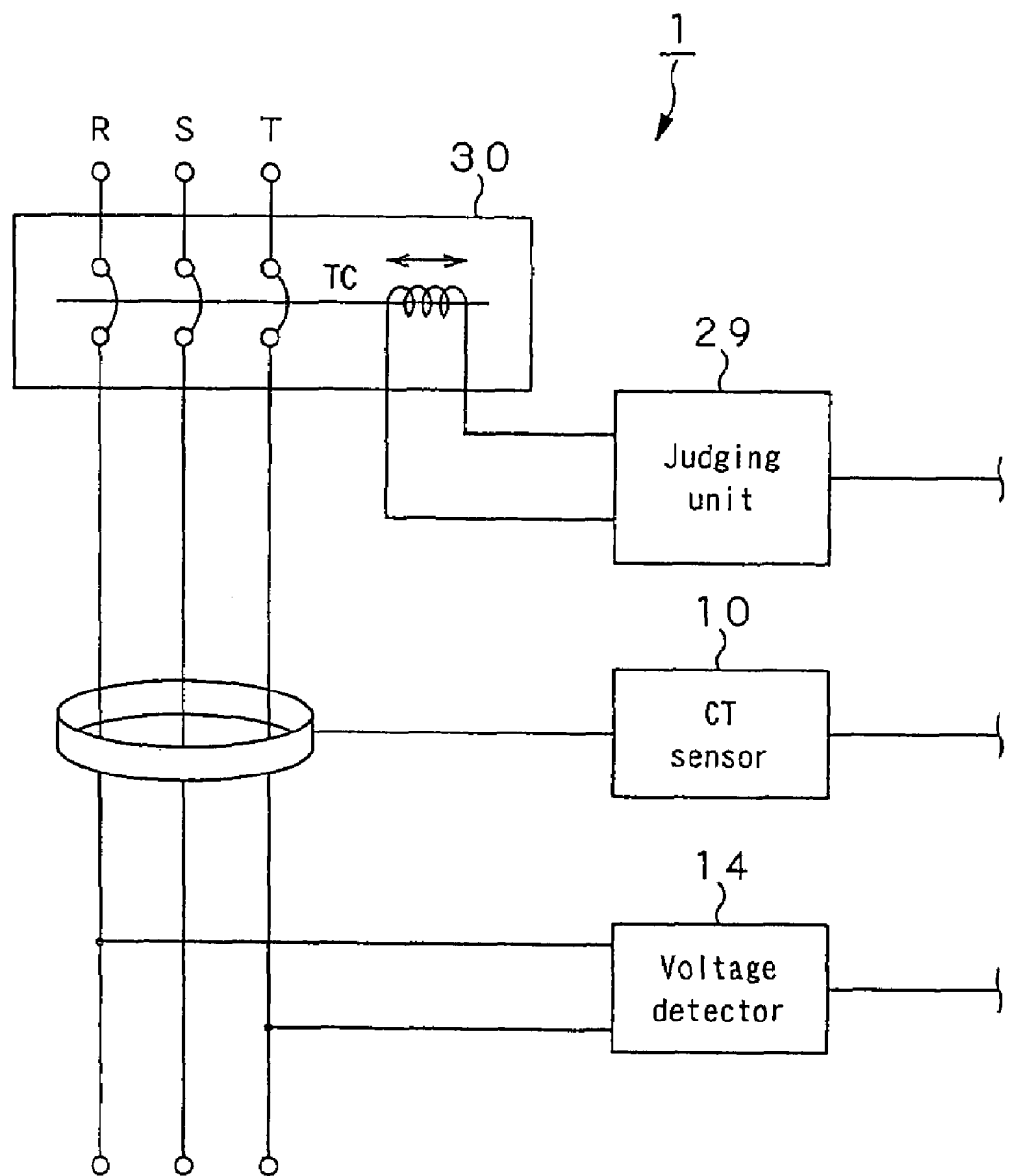
FIG. 3 shows the configuration of a circuit breaker included in the leakage current detector according to the present invention.

The circuit breaker 30 breaks the electric lines A under testing on the basis of the cutoff signal $S_c$ supplied from the judging unit 29. Also, the circuit breaker 30 is formed from a trigger coil TC and the like as shown in FIG. 3, and breaks the electric lines A on the basis of the cutoff signal $S_c$ supplied from the judging unit 29.

Also, the leakage current interrupter 1 may include a setting unit 31 to set an arbitrary value, and may be designed such that the judging unit 29 judges whether the leakage current Igr calculated by the leakage current calculator 27 has exceeded an arbitrary value set by the setting unit 31. In this case, the setting unit 31 may be adapted to select a plurality of preset values by means of a rotary switch. Also, the values are set in steps of 10 mA.

Also, the leakage current interrupter 1 may include a recording unit 32 to record the leakage current Igr calculated by the leakage current calculator 27. Since the recording unit 32 records the leakage current Igr calculated by the leakage current calculator 27 at every elapsed time interval, the user can know how the leakage current Igr changes as time proceeds.

For example, it is assumed that the user connects a monitor to the leakage current interrupter 1 via a communication connector to access data stored in the recording unit 32. It should be noted that the leakage current interrupter 1 should be pre-assigned a unique ID number.

In this case, the monitor will read the root-mean-square value $I_0$ calculated by the root-mean-square value calculator 24, leakage current Igr calculated by the leakage current calculator 27, voltage V on the electric lines A detected by the voltage detector 14, frequency measured by the power frequency measuring unit 21 and ID number of the leakage current interrupter 1 from the leakage current interrupter 1 via the communication connector. Also, the monitor has a round connector for connection to the communication unit 33 and has a disconnection preventive mechanism to prevent poor contact with the communication unit 33.

When it is found from how the leakage current Igr has varied over time that the leakage current Igr has momentarily arrived at an arbitrary value, for example, with reference to data stored in the recording unit 32, it is very likely that the leakage current has been caused by a device put into operation or already in operation when the leakage current Igr has arrived at the arbitrary value, which can be used as clues to locate the leakage.

Also, when it is found from how the leakage current Igr has varied over time that the leakage current Igr has gradually been increased, for example, a device possibly causing a leakage current can be located early by testing the device in operation.

The leakage current interrupter 1 constructed as above according to the present invention can operate even with the electric lines A of a three-phase system, for example, in the same manner as with a single-phase power. Here will be explained the principle of the leakage current interrupter 1 according to the present invention.

The CT sensor 10 clamps the electric lines A under testing, and detects waveforms between R and S phases, between S and T phases and between T and R phases, which are different by 120 deg. from each other as shown in FIG. 4A. It should be noted that FIG. 4A shows the waveforms for convenience of explanation but the waveforms detected by the CT sensor 10 are synthetic ones. The synthetic waveforms detected by the CT sensor 10 are supplied to the calculator 19 via the amplifier 11, LPF 12 and comparator 18.

Also, the voltage detector 14 has a voltage probe thereof connected between the R and T phases to detect a voltage between these R and T phases, and inverts the detected voltage as shown in FIG. 4B. The voltage detector 14 takes, as a reference point a, a point having zero-crossing with a predetermined point of the detected voltage. The voltage V2, whose reference point a is thus determined, is supplied to the calculator 19 via the transformer 15, LPF 16 and comparator 18.

For example, in cases where only the leakage current Igr occurs at the R phase of the electric lines A (the leakage current Igr will be referred to as "R-phase Igr" hereunder) and only the leakage current Igr occurs at the T phase (this leakage current Igr will be referred to as "T-phase Igr" hereunder), the R-phase Igr will have a phase contrast of 120 deg. in relation the reference point a while the T-phase Igr will have a phase contrast of 60 deg. in relation to the reference point a, as shown in FIG. 4C.

Also, in cases where only the leakage current Igc occurs at the R phase of the electric lines A (the leakage current Igc will be referred to as "R-phase Igc" hereunder) and only the leakage current Igc occurs at the T phase (this leakage current Igc will be referred to as "T-phase Igc" hereunder), a synthetic waveform of the R-phase Igc and T-phase Igc will have a phase contrast of 180 deg. (0 deg.) in relation the reference point a as shown in FIG. 4D.

Further, in cases where the leakage currents Igr and Igc occur at the R phase of the electric lines A under testing and also at the T phase, the synthetic waveform will be as shown in FIG. 4E.

Figure 5A:
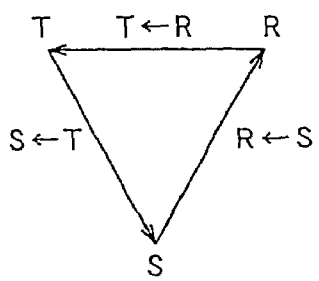
FIG. 5 shows, by vectors, the leakage current detecting by the leakage current detector according to the present invention.
Figure 5B:
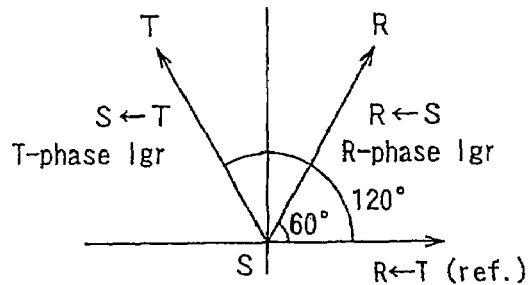

Also, the above description is represented by a vector as follows. Since the electric lines A under testing are of the three-phase system, the vector is as shown in FIG. 5A. A voltage between the R and T phases is detected by the voltage detector 14 and the reference point a is determined from the detected voltage. The single-phase vector is as diagrammatically shown in FIG. 5B. It should be noted that the phase contrast between the R-phase Igr and reference point a is 60 deg. while the phase contrast between the T-phase Igr and reference point a is 120 deg.

Figure 5C:
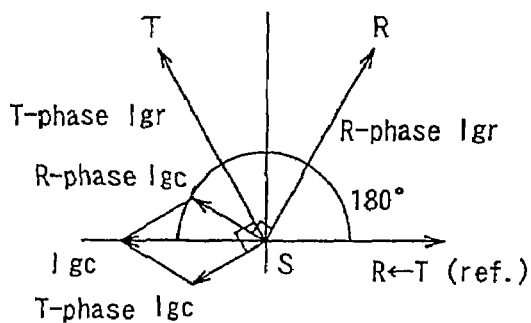

Also, in cases where the electric lines A under testing are of the single-phase system, the R-phase Igc can be found at a point 90 deg. from the R-phase Igr and the T-phase Igc can be found at a point 90 deg. from the T-phase Igr because the phase contrast between the leakage currents Igr and Igc is 90 deg. as was described above with reference to FIG. 2A. Also, a synthetic vector Igc derived from the R-phase Igc and T-phase Igc can be found at a point 180 deg. (0 deg.) from the reference point a (as in FIG. 5C).

Figure 5D:
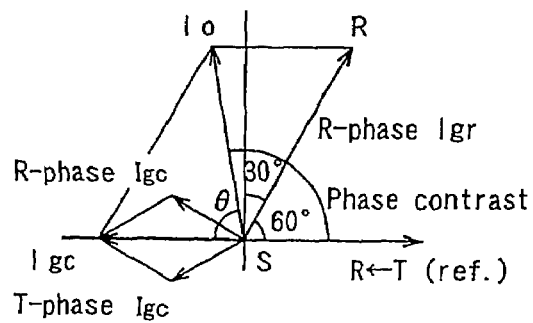

Therefore, in cases where only the R-phase Igr occurs in the electric lines A, for example, a synthetic vector derived from the R-phase Igr and Igc, that is, the leakage current $I_0$ flowing through the electric lines A, can be represented as shown in FIG. 5D. It should be noted that the aforementioned equation (5) can be derived to calculate the R-phase Igr as shown in FIG. 5D. Also, it should be noted that the phase contrast $\theta$ of the leakage current $I_0$ varies 60 to 180 deg. in relation to the reference point a corresponding to the magnitude of the R-phase Igr and Igc.

Figure 5E:
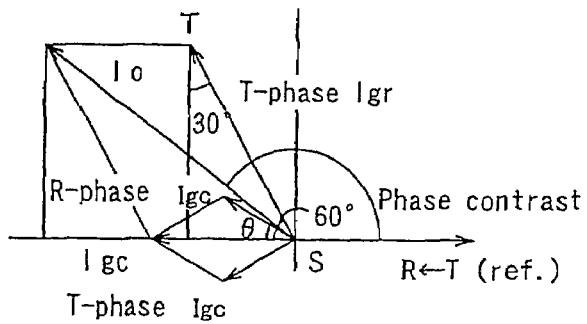

Also, in cases where only the T-phase Igr occurs in the electric lines A, for example, a synthetic vector derived from the T-phase Igr and Igc, that is, the leakage current $I_0$ flowing through the electric lines A, can be represented as shown in FIG. 5E. It should be noted that the aforementioned equation (5) can be derived to calculate the T-phase Igr as shown in FIG. 5E. Also, it should be noted that the phase contrast $\theta$ of the leakage current $I_0$ varies 120 to 180 deg. in relation to the reference point a corresponding to the magnitude of the T-phase Igr and Igc.

Figure 6:
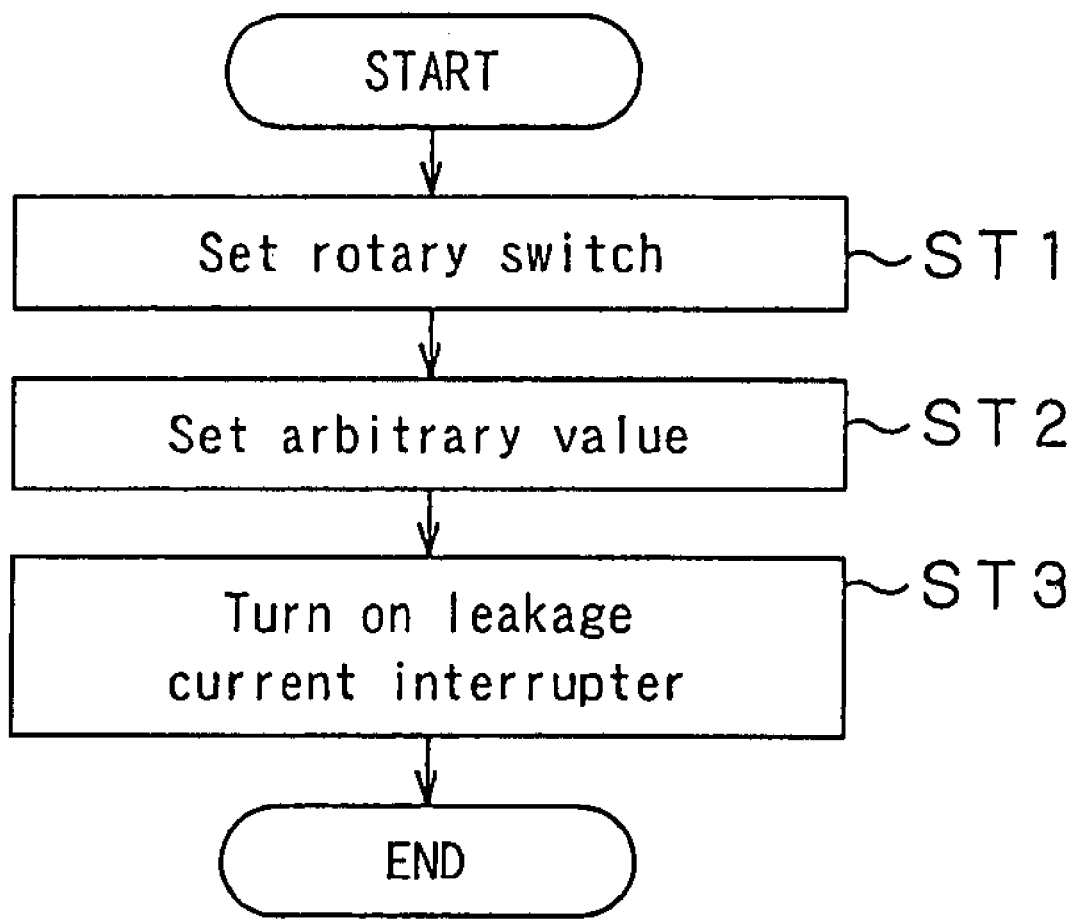
FIG. 6 shows a flow of operations of the leakage current detector according to the present invention.

The operations of the leakage current interrupter 1 according to the present invention to detect the leakage current Igr flowing through the electric lines A under testing and break the latter on the basis of the detected leakage current Igr will be explained below with reference to the flow diagram shown in FIG. 6. It should be noted that the leakage current interrupter 1 is intended to be housed in an existing earth leakage breaker but it may be installed outside the existing earth leakage breaker if it cannot be housed therein.

In step ST1, the user switches a rotary switch (not shown) of the leakage current interrupter 1 corresponding to the type of the electric lines A under testing (single-phase two-wire system, single-phase three-wire system or three-phase three-wire system). It should be noted that in step ST1, the electric lines A are broken.

In step ST2, the user operates the setting unit 31 to set an arbitrary value.

In step ST3, the user turns on the leakage current interrupter 1.

Thereafter, in the leakage current interrupter 1, the leakage current calculator 27 calculates the leakage current Igr through the electric lines A under testing, and the judging unit 29 judges whether the leakage current Igr has reached the arbitrary value. When the judging unit 29 in the leakage current interrupter 1 determines that the leakage current Igr has reached the arbitrary value, the circuit breaker 30 will break the electric lines A.

FIG. 7 shows a first result of the actual leakage current measurement of the electric lines A in the leakage current interrupter 1 according to the present invention. The result shown in FIG. 7 is the result of a measurement made at a power board of a rooftop power incoming and distribution box (high-voltage incoming panel) (power frequency: 50 Hz; mains voltage: 200 V; type of low-voltage lines under testing: three-phase three-wire, 150 kVA; room temperature: 41° C.; humidity: 43%).

In the experiment, a resistor of 20 kΩ was connected as a dummy insulation resistance to the R phase at a time point between 6 min and 9 min (3 min) from the start of measurement, a resistor of 20 kΩ was connected as a dummy insulation resistance to the T phase at a time point between 9 min and 11 min (2 min) from the start of measurement, the resistors were disconnected at a time point between 11 min and 12 min (1 min) from the start of measurement, a resistor of 10 kΩ was connected as a dummy insulation resistance to the R phase at a time point between 12 min and 13 min (1 min) from the start of measurement, a resistor of 10 kΩ was connected as a dummy insulation resistance to the T phase at a time point between 13 min and 15 min (2 min) from start of measurement, and the resistors were disconnected in 15 min from the start of measurement.

For example, in cases where a resistor of 20 kΩ is connected as a dummy insulation resistance to the R phase, a current having the following theoretical value for the dummy insulation resistance will additionally flow through the electric lines A under testing:

$$Igr=V/R=200/(20\times10^3)=10\text{ mA}$$

In the leakage current interrupter 1, a leakage current Igr of 12.3 mA was detected when the resistor of 20 kΩ was connected as a dummy insulation resistance to the R phase at a time point of 6 min from the start of measurement as shown in FIG. 7. Since the leakage currents Igr before a lapse of 6 min from the start of measurement, at a time point between 11 min and 12 min after the start of measurement and 15 min from the start of measurement are 2 mA in cases where the resistors are each not connected as a dummy insulation resistance, subtraction of 2 mA from the leakage current Igr after the resistor of 20 kΩ is connected to the R phase will result in 10.3 mA, which means that the leakage current interrupter 1 according to the present invention could measure a change of 10.3 mA. This value is generally the same as the theoretical value (10 mA).

Also, in cases where a resistor of 20 kΩ is connected as a dummy insulation resistance to the R phase, a synthetic resistance derived from the dummy insulation resistance and resistance before connection of the resistor of 20 kΩ (Gr≈105.46 kΩ (mean value of resistance Gr between a time point before lapse of 6 min from the start of measurement)) will be given as shown below. In the leakage current interrupter 1, the resistance Gr measured at a time point of 6 min from the start of measurement is 17.2 kΩ which is generally the same as the aforementioned theoretical value (16.3 kΩ) as shown in FIG. 7.

$$Gr=(20\times10^3\times105.46\times10^3)/(20\times10^3+105.46\times10^3)\approx16.3\text{ kΩ}$$

Also in cases where a resistor of 20 kΩ is connected as a dummy insulation resistance to the T phase, the current for the dummy insulation resistance is theoretically increased by 10 mA as above. In the leakage current interrupter 1, the leakage current Igr detected at a time point between 9 min and 11 min from the start of measurement is nearly 12.4 mA and subtraction of 2 mA from the measured value results in 10.4 mA which is nearly the same as the theoretical value (10 mA), as shown in FIG. 7.

Also, the synthetic resistance Gr when the resistor of 20 kΩ is connected as a dummy insulation resistance to the T phase is theoretically 16.3 kΩ as above and the measured synthetic resistance is 17.4 kΩ, which means that the measured resistance is almost the same as the theoretical value.

Also, in the leakage current interrupter 1, both the theoretical values of the leakage current Igr and Gr when the resistor of 10 kΩ was connected as a dummy insulation resistance to the R or T phase are also almost the same as their respective measured values as shown in FIG. 7.

Further, in the leakage current interrupter 1, when the resistors as the dummy insulation resistance were disconnected at a time point between 11 min and 12 min from the start of measurement and at a time point 15 min after the start of measurement, the leakage current Igr, $I_0$ and Gr were again the same as those measured before connection of the resistors as the dummy insulation resistance (at a time point between 1 min and 5 min from the start of measurement).

FIG. 8 shows a second result of the actual leakage current measurement of the electric lines A in the leakage current interrupter 1 according to the present invention. The result shown in FIG. 8 is the result of a measurement made at a power board of a power incoming and distribution box (high-voltage incoming panel) (power frequency: 50 Hz; mains voltage: 200 V; type of low-voltage lines under testing: three-phase three-wire, 150 kVA).

In the experiment, a capacitor of 0.22 µF was connected as a dummy capacitance to each of the R and T phases at a time point between 1 min and 4 min (3 min) from the start of measurement, a resistor of 20 kΩ was connected as a dummy insulation resistance to the T phase at a time point between 3 min and 4 min (1 min) from the start of measurement, and the capacitor and resistor were disconnected at a time point of 4 min from the start of measurement. That is, at the time point between 3 and 4 min from the start of measurement, the capacitor was connected to each of the R and T phases and the resistor was connected to the T phase.

When the capacitor of 0.22 µF was connected as a dummy capacitance to each of the R and T phases, the capacitive reactance X was as follows:

$$X=1/2\pi fC=1/(2\pi\times50\times(0.22\times10^{-6}+0.22\times10^{-6}))\approx7.23\times10^3$$

Therefore, a current I having the following value will additionally flow through the electric lines:

$$I=V/X=200/7.23\times10^3\approx27.6\text{ mA}$$

Also, in cases where a resistor of 20 kΩ is connected as an insulation resistance to the T phase, a current having the following theoretical value for the dummy insulation resistance will additionally flow through the electric lines A under testing:

$$Igr=V/R=200/(20\times10^3)=10\text{ mA}$$

In the leakage current interrupter 1, a leakage current Igr of 7.8 mA was detected and $I_0$ of 100.8 mA was detected when the capacitor of 0.22 µF was connected as a dummy capacitance to each of the R and T phases at a time point of 1 min from the start of measurement as shown in FIG. 8. It should be noted that $I_0$ is a synthetic current derived from the leakage current Igr arising from an insulation resistance and leakage current Igc arising from a capacitance.

Since the leakage current Igr, when no capacitor as a dummy capacitance is connected, is 7.6 mA (leakage current Igr measured at a time point before elapse of 1 min from the start of measurement) as shown in FIG. 8, so it will vary little when a capacitor is connected as a dummy capacitance to each of the R and T phases.

On the other hand, the synthetic current $I_0$, when no capacitor as a dummy capacitance is connected, is 75.9 mA ($I_0$ at a time point before elapse of 1 min from the start of measurement). Subtraction of $I_0$ (75.9 mA) before the capacitor as a dummy capacitance is connected from $I_0$ (100.8 mA) after the capacitor is connected will result in 24.9 mA which is the additional leakage current Igc. The additional leakage current Igc is nearly equal to the theoretical value (27.6 mA).

Also, in the leakage current interrupter 1, the leakage current Igr of 21.0 mA was detected and $I_0$ of 107.0 mA was detected when a capacitor was connected as a dummy capacitance to each of the R and T phases and a resistor was connected as dummy insulation resistance to the T phase at a time point between 3 min and 4 min from the start of measurement as shown in FIG. 8.

Subtraction of the leakage current Igr (8 mA (at a time point of 3 min from the start of measurement)) before the resistor as a dummy insulation resistance is connected to the T phase from the leakage current Igr (21 mA) after the resistor is connected will result in 13 mA which is almost equal to the theoretical value (10 mA).

Operations of the comparator 18 and calculator 19 when the resistor of 10 kΩ is connected as a dummy insulation resistance to the R phase will be explained below with reference to FIGS. 9 to 11.

Figure 9:
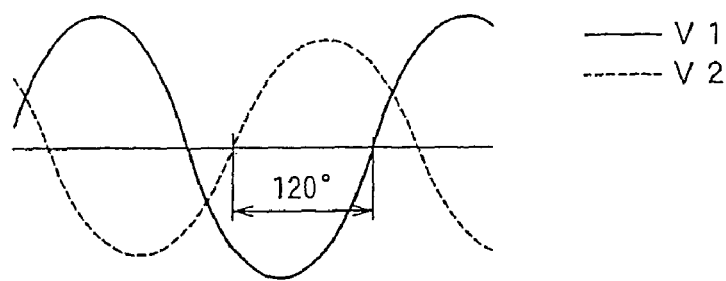
FIG. 9 shows a phase contrast between converted voltages V1 and V2 supplied to a comparator.
Figure 10A:
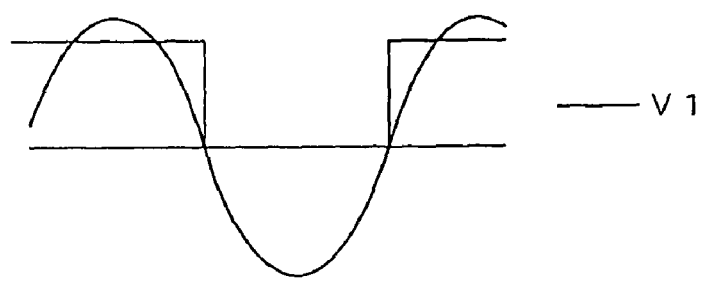
FIG. 10A shows a waveform of the converted voltage V1 supplied to the comparator and a waveform resulting from square-wave conversion made based on the converted voltage V1.
Figure 10B:
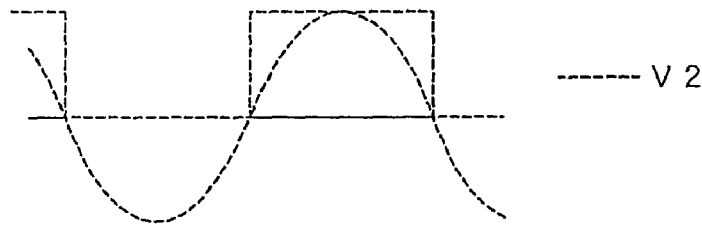
FIG. 10B shows the waveform of the voltage V2 supplied to the comparator and a waveform resulting from square-wave conversion made based on the voltage V2.

The comparator 18 is supplied with the converted voltage V1 from the LPG 12 and voltage V2 from the LPF 16 as shown in FIG. 9. The phase contrast between the converted voltage V1 and voltage V2 is 120 deg. The comparator 18 converts the converted voltage V1 supplied from the LPF 12 into a square-wave signal and supplies the square-wave signal to the calculator 19 as shown in FIG. 10A. Also, the comparator 18 converts the voltage V2 supplied from the LPF 16 into a square-wave signal and supplies the square-wave signal to the calculator 19 as shown in FIG. 10B.

Figure 11:
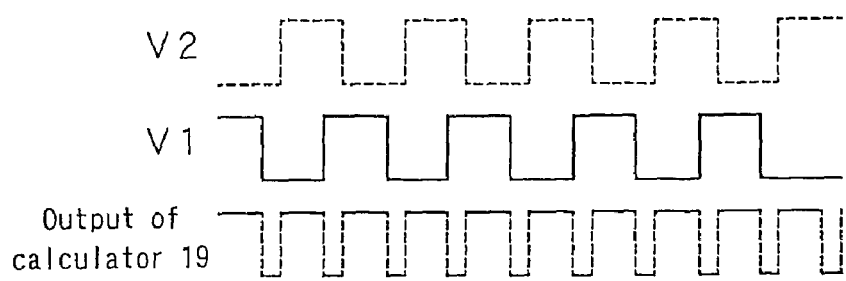
FIG. 11 shows a waveform resulting from square-wave conversion made based on the converted voltage V1 shown in FIG. 10 and a waveform formed when EXOR calculation is made based on the waveform resulting from the square-wave conversion made based on the voltage V2.

The calculator 19 makes an EXOR calculation on the basis of the square-wave signal resulting from the conversion of the converted voltage V1 and square-wave signal resulting from the conversion of the voltage V2 as shown in FIG. 11. The calculator 19 determines a phase pulse width of less than ¼ of one cycle on the basis of a signal resulting from the EXOR calculation, and supplies the determined phase pulse width to the phase angle calculator 22.

The leakage current interrupter 1 constructed as above according to the present invention detects a leakage current I flowing through the electric lines A under testing, converts the detected leakage current I into a voltage and removes a harmonic component from the converted voltage, detects a voltage V2 from a voltage line included in the electric lines A and removes a harmonic component from the detected voltage V2, accurately determines a phase angle θ of the leakage current I flowing through the electric lines A on the basis of the converted voltage V1 having the harmonic component removed and the voltage V2 having the harmonic component removed, calculates only a leakage current Igr arising from an earth insulation resistance from the accurate phase angle θ and root-mean-square value $I_0$ of the converted voltage V1 having the harmonic component removed, monitors the calculated leakage current Igr, and breaks the electric lines A when the leakage current Igr has exceeded an arbitrary value. Therefore, since the leakage current interrupter 1 according to the present invention can positively detect only a leakage current Igr arising from an earth insulation resistance in units of mA even if a leakage current Igc arising from the earth capacitance is increased due to an increased length of the electric lines A under testing or due to an inverter or the like which provides a harmonic distortion power, it can monitor the leakage current Igr and break the electric lines A under testing only when the leakage current Igr has exceeded the arbitrary value. Therefore, the leakage current interrupter 1 according to the present invention will not break the electric lines A like the conventional earth leakage breaker even if the leakage current Igr is increased due to any element (increased leakage current Igc) other than the leakage current Igr.

Also, the leakage current interrupter 1 according to the present invention can detect a leakage current Igr without momentary interruption of the power supply to electric lines, mechanical facility and the like, and can locate a current leakage or short circuit before the latter leads to a catastrophe such as a short circuit-caused fire or the like.

Also, since the leakage current interrupter 1 according to the present invention determines a reference point from a voltage developed on transmission lines without using any existing reference point as in the frequency infusion method, it can accurately measure a leakage current Igr flowing through the electric lines A under testing.

In the foregoing, the present invention has been described in detail concerning certain preferred embodiments thereof as examples with reference to the accompanying drawings. However, it should be understood by those ordinarily skilled in the art that the present invention is not limited to the embodiments but can be modified in various manners, constructed alternatively or embodied in various other forms without departing from the scope and spirit thereof as set forth and defined in the appended claims.

INDUSTRIAL APPLICABILITY

As described in the foregoing, in the leak current breaker and method according to the present invention, a leakage current flowing through electric lines under testing is detected, the detected leakage current is converted into a voltage and a harmonic component is removed from the converted voltage, a voltage developed on a voltage line included in the electric lines is detected and a harmonic component is removed from the detected voltage, a phase angle of the leakage current flowing through the electric lines is accurately determined based on the converted voltage having the harmonic component removed and the voltage having the harmonic component removed, a leakage current alone, arising from an earth insulation resistance, is calculated from the accurate phase angle and root-mean-square value of the converted voltage having the harmonic component removed, the calculated leakage current Igr is monitored, and the electric line is broken when the leakage current has exceeded an arbitrary value. Therefore, in the leak current breaker and method according to the present invention, it is possible to accurately calculate a power frequency (50 or 60 Hz in cases of a commercial power supply) in the electric lines from the voltage having the harmonic component removed and accurately detect a phase contrast between the signal waveform of the input leakage current having the harmonic component removed and that of the voltage having the harmonic component removed on the basis of the calculated power frequency. Thus the phase angle of the leakage current can accurately be calculated. Also, a leakage current arising from only an earth insulation resistance is calculated from the accurate phase angle and root-mean-square value of the leakage current having the harmonic component removed, and the electric lines under testing are broken in cases where the calculated leakage current has exceeded an arbitrary value. Thus, even if the earth capacitance is increased due to an increased length of the electric lines under testing or due to a harmonic distortion current caused by an inverter, it is possible to detect a leakage current alone, arising from only the earth insulation resistance and which will possibly cause a catastrophe such as a short circuit-caused fire or the like and break the electric lines under testing on the basis of the detected leakage current.

Also, with the leak current breaker and method according to the present invention, it is possible to measure a leakage current Igr simply and safely without having to momentarily turn off electric lines and mechanical facility for detection of the leakage current.

The invention claimed is:

1. A leak current breaker comprising:
   a leakage current detecting means for detecting a leakage current flowing through electric lines under testing;
   a converting means for converting the leakage current detected by the leakage current detecting means into a voltage;
   an amplifying means for amplifying the voltage output from the converting means;
   a first harmonic component removing means for removing a harmonic component from the voltage amplified by the amplifying means;
   a voltage detecting means for detecting a voltage developed in the electric lines under testing;
   a second harmonic component removing means for removing a harmonic component from the voltage detected by the voltage detecting means;
   a phase contrast detecting means for detecting a contrast in signal waveform between the voltage from which the harmonic component has been removed by the first harmonic component removing means and the voltage from which the harmonic component has been removed by the second harmonic component removing means;
   a frequency calculating means for calculating a frequency occurring in a voltage line in which the voltage has been detected by the voltage detecting means on the basis of the signal waveform of the voltage having the harmonic component removed by the second harmonic component removing means;
   a phase angle calculating means for calculating a phase angle of the leakage current flowing through the electric lines under testing on the basis of the phase contrast detected by the phase contrast detecting means and frequency calculated by the frequency calculating means;
   a root-mean-square value calculating means for calculating a root-mean-square value of the voltage having the harmonic component removed by the first harmonic component removing means;
   an earth insulation resistance-caused leakage current component calculating means for calculating a leakage current component arising from an earth insulation resistance included in the leakage current flowing through the electric lines under testing on the basis of the root-mean-square value calculated by the root-mean-square value calculating means and phase angle of the leakage current flowing through the electric lines under testing, calculated by the phase angle calculating means;
   a judging means for judging whether the leakage current component arising from the earth insulation resistance included in the leakage current flowing through the electric lines under testing and calculated by the earth insulation resistance-caused leakage current component calculating means has exceeded an arbitrary value; and
   a circuit breaking means for breaking the electric lines under testing on the basis of the judgment made by the judging means.

2. The leak current breaker according to claim 1, further comprising a setting means for setting the arbitrary value, the judging means judging whether the leakage current component arising from the earth insulation resistance included in the leakage current flowing through the electric lines under testing and calculated by the earth insulation resistance-caused leakage current component calculating means has exceeded an arbitrary value set by the setting means.

3. The leak current breaker according to claim 1, further comprising a recording means for recording the leakage current component calculated by the earth insulation resistance-caused leakage current component calculating means.

4. The leak current breaker according to claim 1, wherein the leakage current detecting means detects a leakage current flowing through the electric lines under testing with the electric lines under testing including a grounding line being clamped.

5. The leak current breaker according to claim 1, wherein in cases where the electric lines under testing are of a three-phase multi-wire system, the voltage detecting means combines voltages detected in a plurality of voltage lines included in the electric lines under testing and supplies the combined voltages to the second harmonic component removing means.

6. The leak current breaker according to claim 1, wherein the phase angle calculating means calculates, by an equation given below, a phase angle $\theta$ of the leakage current detected by the leakage current detecting means from a phase pulse width W detected by the phase contrast detecting means and frequency F calculated by the frequency calculating means:

$$\theta = 360 \times W \times F.$$

7. The leak current breaker according to claim 1, wherein:
   the root-mean-square value calculating means calculates, by an equation given below, a root-mean-square value $I_0$ of the voltage having the harmonic component removed by the first harmonic component removing means:

$$I_0 = I \times (\pi/2)\sqrt{2}$$

the earth insulation resistance-caused leakage current calculation means calculates, by an equation given below, a leakage current component Igr arising from an earth insulation resistance included in the leakage current flowing through the electric lines under testing from a root-mean-square value $I_0$ calculated by the root-mean-square value calculating means and a phase angle $\theta$ of the leakage current flowing through the electric lines under testing and calculated by the phase angle calculating means:

$$Igr = I_0 \times \cos\theta.$$

8. The leak current breaker according to claim 1, wherein in cases where the electric lines under testing are of a three-phase multi-wire system:
   the root-mean-square value calculating means calculates, by an equation given below, a root-mean-square value $I_0$ of the voltage having the harmonic component removed by the first harmonic component removing means:

$$I_0 = I \times (\pi/2)\sqrt{2}$$

the earth insulation resistance-caused leakage current calculation means calculates, by an equation given below, a leakage current component Igr arising from an earth insulation resistance included in the leakage current flowing through the electric lines under testing from a root-mean-square value $I_0$ calculated by the root-mean-square value calculating means and a phase angle $\theta$ of the leakage current flowing through the electric lines under testing and calculated by the phase angle calculating means:

$$Igr = (I_0 \times \sin\theta) \times \cos 30°.$$

9. The leak current breaker according to claim 1, further comprising a digital converting means for making digital conversion of the leakage current having the harmonic component removed by the first harmonic component removing means, the root-mean-square value calculating means calculates a root-mean-square value of a voltage digital-converted by the digital converting means.

10. A leakage current interruption method comprising:

a leakage current detecting step of detecting a leakage current flowing through electric lines under testing;

a converting step of converting the leakage current detected in the leakage current detecting step into a voltage;

an amplifying step of amplifying the voltage output from the converting step;

a first harmonic component removing step of removing a harmonic component from the voltage amplified in the amplifying step;

a voltage detecting step of detecting a voltage developed in the electric lines under testing;

a second harmonic component step of removing a harmonic component from the voltage detected in the voltage detecting step;

a phase-contrast detecting step of detecting a contrast in signal waveform between the voltage from which the harmonic component has been removed in the first harmonic component removing step and the voltage from which the harmonic component has been removed in the second harmonic component removing step;

a frequency calculating step of calculating a power frequency occurring in a voltage line in which the voltage has been detected in the voltage detecting step on the basis of the signal waveform of the voltage having the harmonic component removed in the second harmonic component removing step;

a phase angle calculating step of calculating a phase angle of the leakage current flowing through the electric lines under testing on the basis of the phase contrast detected in the phase contrast detecting step and power frequency calculated in the frequency calculating step;

a root-mean-square value calculating step of calculating a root-mean-square value of the voltage having the harmonic component removed in the first harmonic component removing step;

an earth insulation resistance-caused leakage current component calculating step of calculating a leakage current component arising from an earth insulation resistance included in the leakage current flowing through the electric lines under testing on the basis of the root-mean-square value calculated in the root-mean-square value calculating step and phase angle of the leakage current flowing through the electric lines under testing, calculated in the phase angle calculating step;

a judging step of judging whether the leakage current component arising from the earth insulation resistance included in the leakage current flowing through the electric lines under testing and calculated in the earth insulation resistance-caused leakage current component calculating step has exceeded an arbitrary value; and a breaking step of breaking the electric lines under testing on the basis of the judgment made in the judging step.

\* \* \* \* \*